United States Patent
Ogino et al.

(10) Patent No.: US 7,294,905 B2
(45) Date of Patent: Nov. 13, 2007

(54) THIN FILM CAPACITOR AND ELECTRONIC CIRCUIT COMPONENT

(75) Inventors: Masahiko Ogino, Hitachi (JP); Toshiya Satoh, Kanasago (JP); Takao Miwa, Hitachinaka (JP); Toshihide Nabatame, Hitachinaka (JP); Satoru Amou, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/483,378

(22) PCT Filed: Jul. 12, 2002

(86) PCT No.: PCT/JP02/07089

§ 371 (c)(1), (2), (4) Date: Jan. 12, 2004

(87) PCT Pub. No.: WO03/007320

PCT Pub. Date: Jan. 23, 2003

(65) Prior Publication Data

US 2004/0195567 A1    Oct. 7, 2004

(30) Foreign Application Priority Data

Jul. 12, 2001    (JP)    ................ 2001-211535

(51) Int. Cl.
*H01L 29/00*    (2006.01)
(52) U.S. Cl. .............. 257/532; 257/301; 257/303; 257/E29.342; 257/E27.116
(58) Field of Classification Search ............. 257/303, 257/310, 306–307, 766, 751; 438/240, 253, 438/396; 361/306.3, 321.1; 29/25.01, 25.02, 29/25.03
See application file for complete search history.

(56) References Cited

U.S. PATENT DOCUMENTS

| | | | | |
|---|---|---|---|---|
| 3,568,010 A | * | 3/1971 | Maserjian | 361/322 |
| 3,969,197 A | * | 7/1976 | Tolar et al. | 205/122 |
| 4,585,901 A | * | 4/1986 | Miller | 174/35 MS |
| 5,671,027 A | * | 9/1997 | Sasano et al. | 349/46 |
| 5,889,573 A | * | 3/1999 | Yamamoto et al. | 349/152 |
| 6,072,689 A | * | 6/2000 | Kirlin | 361/311 |
| 6,180,976 B1 | * | 1/2001 | Roy | 257/306 |
| 6,285,542 B1 | * | 9/2001 | Kennedy et al. | 361/328 |
| 6,498,714 B1 | * | 12/2002 | Fujisawa et al. | 361/306.3 |
| 6,515,324 B2 | * | 2/2003 | Shibuya et al. | 257/296 |
| 6,545,354 B1 | * | 4/2003 | Aoki et al. | 257/734 |
| 6,551,653 B1 | * | 4/2003 | Hatke et al. | 427/171 |
| 6,620,673 B1 | * | 9/2003 | LaFleur | 438/240 |
| 6,674,136 B1 | * | 1/2004 | Ohtani | 257/408 |
| 6,709,991 B1 | * | 3/2004 | Kawahara et al. | 438/791 |
| 6,754,952 B2 | * | 6/2004 | Takano et al. | 29/852 |
| 6,756,441 B2 | * | 6/2004 | Amou et al. | 524/575 |
| 6,872,893 B2 | * | 3/2005 | Fukuoka et al. | 174/255 |

(Continued)

FOREIGN PATENT DOCUMENTS

JP    56-88312    7/1981

(Continued)

*Primary Examiner*—Thao X. Le
(74) *Attorney, Agent, or Firm*—Crowell & Moring LLP

(57) ABSTRACT

A thin film capacitor comprising a lower electrode formed on a predetermined surface, a dielectric layer formed on the lower electrode, and an upper electrode formed on the dielectric layer, wherein the end portion of the lower electrode is further covered by an insulator other than the dielectric layer.

15 Claims, 4 Drawing Sheets

U.S. PATENT DOCUMENTS

| | | |
|---|---|---|
| 6,933,601 B2 * | 8/2005 | Satoh et al. ................ 257/698 |
| 2002/0025623 A1 * | 2/2002 | Yamamichi et al. ........ 438/239 |
| 2002/0043399 A1 * | 4/2002 | Sasaki et al. ............... 174/260 |
| 2003/0057419 A1 * | 3/2003 | Murakami et al. ............ 257/72 |
| 2003/0162386 A1 * | 8/2003 | Ogawa et al. .............. 438/637 |
| 2004/0036551 A1 * | 2/2004 | Hirabayashi ................ 333/101 |
| 2004/0081811 A1 * | 4/2004 | Casper et al. ............... 428/209 |
| 2004/0238941 A1 * | 12/2004 | Satoh et al. ................ 257/698 |
| 2004/0246692 A1 * | 12/2004 | Satoh et al. ................ 361/782 |

FOREIGN PATENT DOCUMENTS

| | | |
|---|---|---|
| JP | 04-336530 | 11/1992 |
| JP | 07-283077 | 10/1995 |

* cited by examiner

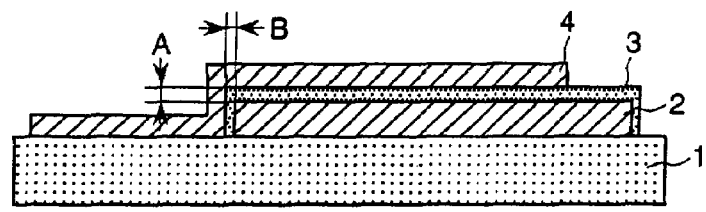
FIG. 1 PRIOR ART
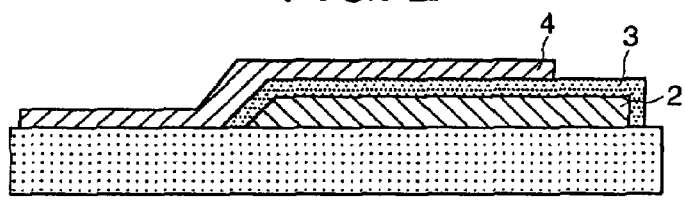
FIG. 2 PRIOR ART
FIG. 3-2-a
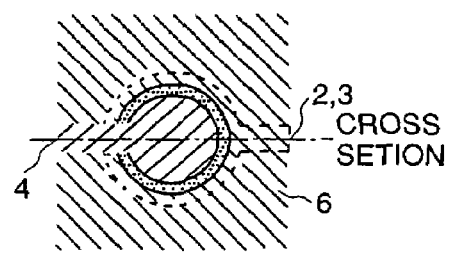
FIG. 3-1
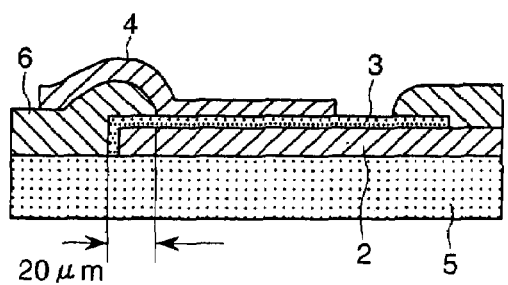
FIG. 3-2-b
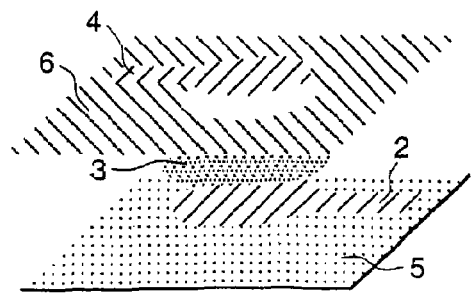

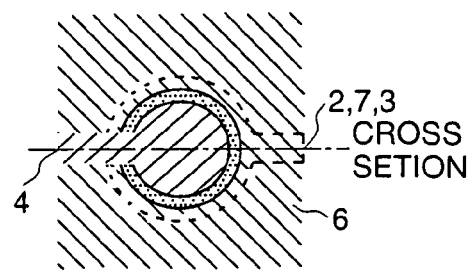
FIG. 4-2-a
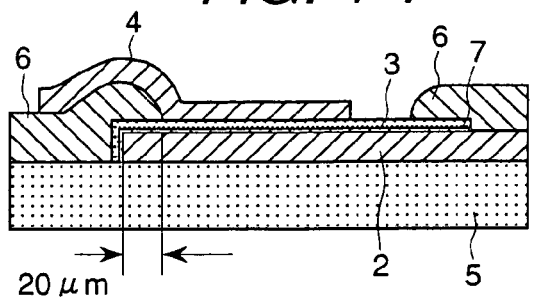
FIG. 4-1
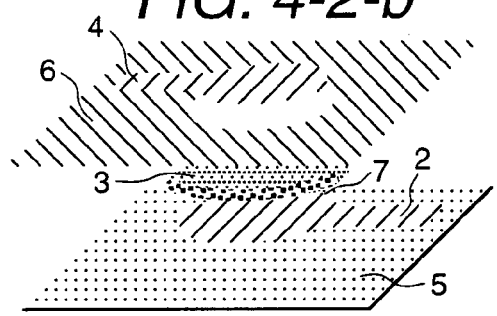
FIG. 4-2-b
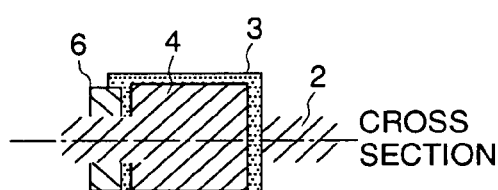
FIG. 5-2-a
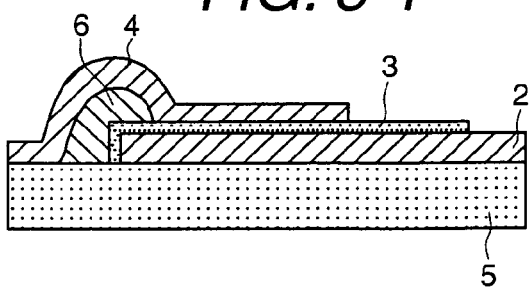
FIG. 5-1
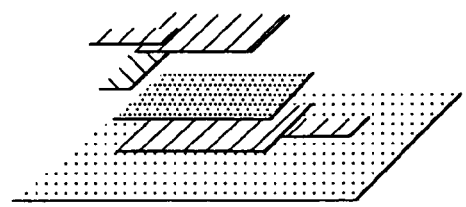
FIG. 5-2-b
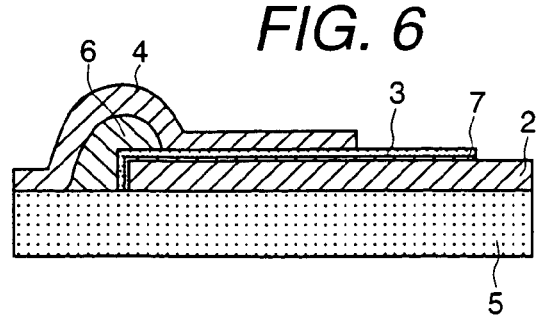
FIG. 6

FIG. 10

| | DEFECTIVE RATE | | DEFECTIVE RATE | | DEFECTIVE RATE |
|---|---|---|---|---|---|
| EMBODIMENT 1 | 0/20 | EMBODIMENT 8 | 0/20 | EMBODIMENT 15 | 0/20 |
| EMBODIMENT 2 | 0/20 | EMBODIMENT 9 | 0/20 | EMBODIMENT 16 | 0/20 |
| EMBODIMENT 3 | 0/20 | EMBODIMENT 10 | 0/20 | EMBODIMENT 17 | 0/20 |
| EMBODIMENT 4 | 0/20 | EMBODIMENT 11 | 0/20 | EMBODIMENT 18 | 0/20 |
| EMBODIMENT 5 | 0/20 | EMBODIMENT 12 | 0/20 | EMBODIMENT 19 | 0/20 |
| EMBODIMENT 6 | 0/20 | EMBODIMENT 13 | 0/20 | EMBODIMENT 20 | 0/20 |
| EMBODIMENT 7 | 0/20 | EMBODIMENT 14 | 0/20 | EMBODIMENT 21 | 0/20 |

| | DEFECTIVE RATE |
|---|---|
| EMBODIMENT 22 | 0/20 |
| EMBODIMENT 23 | 0/20 |
| EMBODIMENT 24 | 0/20 |
| EMBODIMENT 25 | 0/20 |
| EMBODIMENT 26 | 0/20 |
| COMPARISON 1 | 14/20 |
| COMPARISON 2 | 12/20 |

THIN FILM CAPACITOR AND ELECTRONIC CIRCUIT COMPONENT

FIELD OF THE INVENTION

The present invention relates to a thin film capacitor and an electronic circuit component.

BACKGROUND ART

A schematic cross sectional view of a conventional thin film capacitor is shown in FIG. 1. After forming a metal film on a formed substrate 1 such as by a sputtering device, a resist is formed through a conventional photolithograph process and a lower electrode 2 is formed such as by dry etching. Thereafter, a dielectric material is formed by sputtering or CVD, then a dielectric layer 3 is formed through photolithography. Further, an upper electrode 4 is formed in the same manner as in the formation of the lower electrode. Through the above processes a conventional thin film capacitor was manufactured. Further, JP-A-9-289611 discloses a thin film capacitor in which, after forming a sidewall face inclined at a gentle angle at the edge portion of a lower electrode as shown in FIG. 2, a dielectric layer 3 and an upper electrode 4 are formed. As the method of forming the sidewall face at the lower electrode edge, a metal thin film is formed on a substrate. A resist is formed on the metal thin film, and then ion beams are irradiated onto the metal thin film at a predetermined angle $\theta$.

In the conventional capacitor as shown in FIG. 1, the film thickness B of the dielectric layer at the step portion of the lower electrode edge portion is thinner than the film thickness A over the lower electrode. As a result, the distance between the upper and lower electrodes is shortened. For this reason, dielectric breakdown voltage is reduced and shorting between the electrodes tends to be caused due to factors such as dielectric layer defects. Further, in the case of a capacitor as shown in FIG. 2, since the inclination is formed only in a predetermined direction, when a plurality of capacitors are formed on a common substrate, the leading direction of lead wires of the upper electrode is limited to a single direction. Therefore, the circuit design is greatly restricted.

JP-A-4-336530 discloses a liquid crystal display in which a dielectric film insulating between the edge face of a lower electrode for a holding capacitor and a transparent pixel electrode is formed thicker than a dielectric film constituting the holding capacitor. However, in the capacitor used for the liquid crystal display, the thickness of the dielectric film is thin, so the above problem never happens.

An object of the present invention is to provide a highly reliable thin film capacitor, which prevents shorting between the electrodes and reduction of the dielectric breakdown voltage of the thin film capacitor elements and reduces the defects rate thereof.

Another object of the present invention is to provide a low defects rate as well as highly reliable electronic circuit incorporating such a capacitor.

SUMMARY OF THE INVENTION

This and other objects and advantages of the invention are achieved by a first aspect of the present invention which provides a thin film capacitor comprising a lower electrode formed on a predetermined face; a dielectric layer of dielectric material formed on the lower electrode; and an upper electrode formed on the dielectric layer, characterized in that the edge portion of the lower electrode is further covered by an insulator body other than the dielectric layer, and a barrier layer is formed between the dielectric layer and the lower electrode.

Further, a second aspect of the present invention is to provide an electronic circuit part comprising a substrate being provided with a plurality of through holes at predetermined positions; one or more capacitor elements, one or more inductor elements and one or more resistor elements formed on one or both sides of the substrate; conductive portions formed inside the through holes provided at the substrate for electrically connecting both sides of the substrate; lead wires for electrically connecting the capacitor elements, the inductor elements, the resistor elements and the conductive portions; inter layer insulation layers for insulating between the elements and lead wires an external electrode for inputting and outputting electrical signals, wherein the capacitor elements, the inductor elements and the resistor elements are laminated via the inter layer insulation layer; a lower electrode on which predetermined face the capacitor elements are formed; a dielectric layer of dielectric material formed on the lower electrode; and an upper electrode formed on the dielectric layer, characterized in that the edge portion of the lower electrode is further covered by an insulator body other than the dielectric layer and a barrier layer is formed between the dielectric layer and the lower electrode.

The lower electrode according to the present invention is preferably to be a low electrical resistance conductive material. More specifically, such as gold, copper, nickel, aluminum, platinum, tungsten, molybdenum, iron, niobium, titanium, nickel/chromium alloy, iron/nickel/chromium alloy and tantalum nitride are enumerated for the material. In particular, copper is preferable because of its low electric resistance. Further, the surface of the lower electrode is required to be flat and the unevenness of the surface is preferably below $\frac{1}{25}$ of the thickness of the dielectric body. As a methods of forming the lower electrode, the conductive material can be formed in a film having a predetermined film thickness. A resist pattern is formed and the electrode is formed by dry or wet etching, after forming the resist pattern. The electrode can also be formed by electro or electro less plating. Further, with regard to the thickness of the lower electrode according to the present invention, the thicker the electrode is, the more the performance thereof is enhanced; however the thickness need not to be defined. Still further, when the thickness of the lower electrode exceeds more than six times the thickness of the dielectric layer, problems such as reduction of the dielectric breakdown voltage and shorting between the electrodes are likely to occurs. Therefore, the structure of the present invention is particularly effective.

The barrier layer of the present invention is formed on the lower electrode. For the barrier layer a material having a low oxygen permeability, which prevents oxygen dispersion inside the lower electrode at the time of the dielectric layer formation, is preferable. Specifically, metals such as chromium, tungsten, platinum, nickel and oxides such as tungsten oxide, strontium oxide, tungsten/strontium oxide, $BaWO_4$, $Al_2O_3$, $CeO_2$ and barium/strontium/tungsten oxide are enumerated. These barrier layers are formed on the lower electrode such as by a sputtering device.

The dielectric layer of the present invention is formed by a material used commonly for a capacitor and there are no particular material limitations therefor. Specifically, oxides such as $Ta_2O_5$, $BST(Ba(x)Sr(1-x)TiO, 0<x<1)$, $SrTiO_3$, $TiO_2$, $MnO_2$, $Y_2O_3$, $SnO_2$ and $MgTiO_3$, barium titanium oxide, compound formed by doping zirconium and tin into barium titanium oxide, WO3, SrO, mixed barium/strontium oxide, BaWO4, and CeO2 are enumerated. The method of forming the dielectric layer is not limited and a sputtering method, a dry method such as plasma CVD method and a wet method such as anodic oxidation method can be used. Among the above, Ta2O5 is in particular preferable because of its high dielectric strength.

The insulator of the present invention can be any common insulation material used for an insulation film. The insulator covers a lower electrode end edge portion constituted by the lower electrode surface and the lower electrode, end side face and the lower electrode end side face so as to prevent a possible electric shorting between the upper and lower electrodes. Accordingly, a material, which surely covers the lower electrode edge portion and the lower electrode end side face is preferable. Specifically, a variety of thermosetting resins such as polyimide resin, benzocyclo butene resin, epoxy resin, unsaturated polyester resin, epoxy isocyanate resin, maleimide resin, maleimide epoxy resin, cyanic acid ester resin, cyanic acid ester epoxy resin, cyanic acid ester maleimide resin, phenol resin, diallyl phthalate resin, urethane resin, cyanamide resin and maleimide cyanamide resin, materials formed by combining two or more resins above and materials mixing inorganic filler therein can be used. In particular, poly imide resin is preferable because of its excellent heat resistance and chemical resistance, and further, materials provided with photosensitivity are preferable because of excellent workability. Further, benzocyclo butene is preferable because of its low dielectric loss tangent when the capacitor of the present invention is used for a high frequency parts. Resin compositions having low dielectric loss tangent as expressed by the following general chemical formula

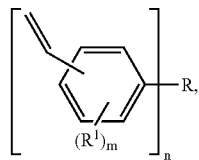

which includes a bridging component having a plurality of styrene groups and further includes polymers having weight average molecular weight of more than 5000 are also preferable, because the transmission loss can be reduced when the capacitor of the present invention is used for the high frequency parts. For skeletons connecting the styrene groups of the above resin composition, hydrocarbon skeletons containing alkylene groups such as methylene and ethylene are preferred. Specifically, 1,2-bis (p-biphenyl) ethane, 1,2-bis (m-biphenyl) ethane and their equivalents, homopolymer of divinyl benzene having vinyl group at the side chains and oligomers of copolymers such as with styrene are enumerated.

Other than the above materials, resins having low elasticity such as fluoro rubber silicone rubber, fluoro silicone rubber, aklyle rubber, hydronitryl rubber, ethylene propylene rubber, chloro sulfonated polyethylene, epichlorhydline rubber, butyl rubber, urethane rubber, polycarbonate/aklylonitril butadiene styrene alloy,polysiloxane dimethylene terephthalate copolymer polybutylene terephthalate/poly carbonate alloy, polytetrafluoroethylene, florinated ethylene propylene, poly arylate, poly amide/aklylonitril butadiene styrene alloy, denaturated epoxy, denaturated polyolefin and siloxane denaturated poly amide can also be used. Inorganic materials other than the above organic materials can be used as the insulator of the present invention, if the same can cover the lower electrode end edge portion and the lower electrode end side face.

These insulators can be formed by a method which controls configuration through a predetermined exposure and development process while providing a photosensitivity thereto. For example, after forming organic insulation material such as by spin coating method, patterns are formed such as by laser and dry etching and combination thereof can be used. Further, A pattern printing method such as printing method, ink jet method and electro photography method and a film adhering method can also be used.

As the substrate of the present invention, glass and ceramic substrates can be enumerated, however, the materials thereof are not limited thereto. The substrate of the present invention should allow for via hole processing, because conductive layers are formed on the upper and bottom surfaces of the substrate, therefore, a substrate having an excellent workability is preferable. Specifically, glasses containing at least one rare earth element selected among the group including Sc, Y, La, Pr, Nd, Pm, Sm, Eu, Gd, Tb, Dy, Ho, Er, Tm, Yb and Lu are in particular preferable because of their excellent durability and high workability. Further, a photosensitive glass which permits the via holes formation through the exposure and development can be used.

The conductive member formed inside the via holes provided in the substrate of the present invention is not limited in particular, if the same can electrically connect the conductive layers on the both surfaces of the substrate. Specifically, after processing via holes, such as in a glass substrate by laser and sand blast, a metal layer can be formed inside the via holes by sputtering, CVD, or by plating after forming the conductive layers. Further, the conductive member can be formed by filling the via holes with conductive resin.

The wiring layers of the present invention are for electrically connecting between the upper and lower electrodes for the capacitor element, inductor element, resistor element, the external electrode and conductive member inside the via holes. The materials are not limited in particular, if the electric resistance of the conductive material is small. More specifically, gold, copper, nickel, aluminum, platinum, tungsten, molybdenum, iron, niobium, titanium, nickel/chromium alloy, iron/nickel/chromium alloy and tantalum nitride are enumerated for the material. Preferably, gold, copper, nickel, aluminum, platinum, tungsten, molybdenum, iron, niobium, titanium, nickel/chromium alloy, iron/nickel/chromium alloy and tantalum nitride are enumerated for the material. In particular, copper is preferable because of its electrical resistance when the method of formation is forming a metal layer by making use of a sputtering method, forming a patterning masks with a resist, and then forming wiring layers such as by etching and plating.

The inductor element of the present invention is not in particular limited, if the same is an inductive circuit element, such as a spiral type formed on a plane, one formed by laminating the spiral type, and a solenoid type can be used.

Further, the inductor element can be either the same material or different material as the lower and upper electrodes for the capacitor element and the material therefore is selected properly according to electrical conductivity, adhesive property with the surrounding materials and formation method. Further, the formation method therefor is not in particular limited. For example, Cu film can be formed by making use of sputtering method and Ti and Cr films can be formed at the interface thereof in view of adhesive property with the surrounding materials. Further, after forming a thin film operating as a seed film with Cu through sputtering method, the inductor element can be formed by electrolytic plating. Further, as patterning methods of the wiring and the inductor element, common wire patterning methods such as etching method and lift off method can be used. Further, the wiring and the inductor element can also be formed through printing method by making use of resin paste containing metal such as Ag. Still further, when the forming temperature of the dielectric layer is high, a metal having oxidation resistant and heat resistant properties such as Pt can be used.

The resistance element of the present invention is structured by sandwiching a resistance material between two metal electrodes and the resistance material is not limited in particular, if a common resistor material is used, such as CrSi and TiN. The formation method therefor is also not limited in particular and for example, sputtering method and plasma CVD method can be used.

The insulating material of the interlayer insulation layer of the present invention is not limited in particular, if the same can prevent electric shorting between wirings and conductive portions of the inductor element and capacitor element. The same insulating materials as referred to above can be used for the interlayer insulation layer. As the formation method thereof, after forming the insulation layer in film such as by spin coat, screen printing and film lamination, the interlayer insulation layer is formed by opening the interlayer connecting portion such as with laser, photolithography process and dry etching.

The external electrode of the present invention is a conductive body for electrically connecting the electronic circuit parts mounted on the substrate, and specifically, a ball shaped body of solder alloy containing tin, zinc and lead, silver, copper, gold or one coated by gold. Additionally, an alloy formed by combining one or more of molybdenum, nickel, copper, platinum and titanium or a terminal having multi layered structure can be used.

Since a material having large resistance such as Cr is used for the material forming the barrier layer, the thickness of the barrier layer is preferably thin in comparison with the thickness of the lower electrode and the dielectric layer. Further, the thinner the thickness of the dielectric layer, the larger the capacitance becomes and the thicker the thickness of the lower electrode, the more the electrical performance thereof is enhanced. For this reason, the following thickness relationship between the lower electrode, dielectric layer and barrier layer is preferable; lower electrode>dielectric layer>barrier layer In view of the covering property for the lower electrode end portion the thickness of the insulator is preferably formed thicker than the thickness of the lower electrode. Further, if the thickness relationship between the lower electrode and the insulator is insulator>lower electrode, in an electronic parts in which wirings are formed in multi layers, the yield thereof is enhanced because of the enhanced flatness of the insulator.

As the material of the dielectric layer, an organic material can be used and further, the same organic material as the insulator can also be used. When an organic material is used for the insulator layer, an organic material usually shows a low dielectric constant, which is effective when forming a small capacity capacitor. Further, when a same organic material is used both for the dielectric layer and the insulator, the dielectric layer and the insulator can be formed with the same device and a same reagent, therefore, the capacitor or the electronic parts can be efficiently formed with low cost.

When the same material is used for the insulator covering the lower electrode end portion and for the interlayer insulation film, the formation of the insulator and interlayer insulation film can be performed with a single process, therefore, the capacitor or the electronic parts can be formed efficiently with low cost.

The insulator of the present invention is preferable to show low dielectric constant in view of the electric performance thereof and the dielectric constant relationship between the insulator and the dielectric layer is preferably; dielectric layers$\geq$insulator The area relationship between the lower electrode, dielectric layer, the opening portion of the insulator on the lower electrode and the upper electrode is preferably; dielectric layer$\geq$lower electrode$\geq$opening portion of insulators$\geq$upper electrode. In order to prevent reduction of dielectric strength or shorting between the electrodes, it is preferable to form a dielectric layer at the side face of the lower electrode and further, the area of the dielectric layer is preferably larger than that of the lower electrode. Since the lower electrode end portion is covered by the insulator, the area of the opening portion of the insulator on the lower electrode is smaller than that of the lower electrode. Further, since the patterning accuracy of the upper electrode is better than the opening accuracy of the insulator, it is preferable to form the area of the upper electrode to be smaller than that of the opening of the insulator on the lower electrode. Namely, when the area of the upper electrode is formed smaller than that of the insulator of the opening on the lower electrode, the capacitance of the capacitor is determined by the area of the upper electrode, therefore, the accuracy of the capacitor is enhanced and the yield thereof can be improved.

BRIEF DESCRIPTION OF THE DRAWINGS

FIG. 1 is a schematic cross sectional view of a conventional thin film capacitor;

FIG. 2 is a schematic cross sectional view of another conventional thin film capacitor;

FIG. 3 is a schematic cross sectional view of a thin film capacitor representing an embodiment of the present invention;

FIG. 4 is a schematic cross sectional view of a thin film capacitor representing another embodiment of the present invention;

FIG. 5 is a schematic cross sectional view of a thin film capacitor representing still another embodiment of the present invention;

FIG. 6 is a schematic cross sectional view of a thin film capacitor representing further embodiment of the present invention;

FIG. 10 is a table showing defective rates of the respective embodiments.

THE BEST MODES FOR CARRYING OUT THE INVENTION

Figure 7:
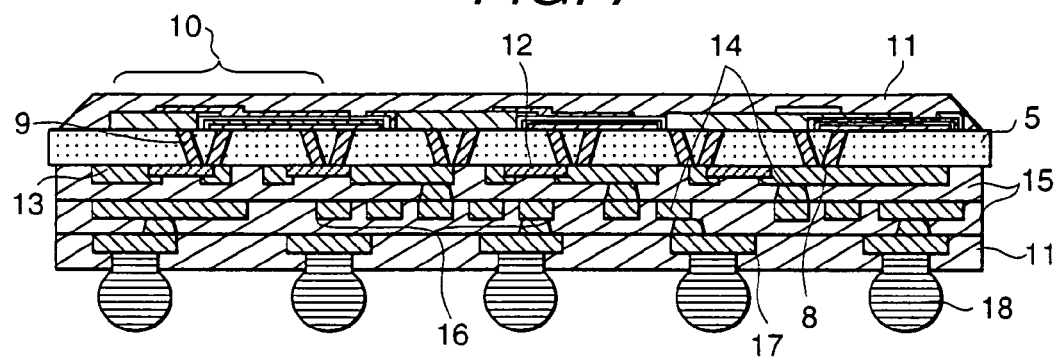
FIG. 7 is a schematic cross sectional view of an electronic circuit part representing an embodiment of the present invention.

Hereinbelow, embodiments of the present invention will be explained with reference to the drawings.

EMBODIMENT 1

FIG. 3-1 is a cross sectional view of a thin film capacitor representing an embodiment of the present invention. FIG. 3-2-*a* is a plan view of the thin film capacitor of the present embodiment. FIG. 3-2-*b* is an exploded view of the thin film capacitor of the present embodiment. Further, FIG. 3-1 is the cross sectional view taken along the cross sectional plan indicated in FIG. 3-2-*a*.

The thin film capacitor was produced in the following manner.

Platinum film of 2 µm was formed on a glass substrate 5 by sputtering method. Subsequently, positive type liquid resist OFPR800, 500 cp(product of Tokyo Ohka) is coated and after performing drying, exposing and developing process, a resist mask for a lower electrode was formed. Then, dry etching was performed by ion milling to remove unnecessary platinum portions and after removing the resist mask the lower electrode 2 was formed. In the present embodiment, the shape of the lower electrode is formed in a circle as shown in FIGS. 3-2-*a* and 3-2-*b*. Further, at the side face thereof a wire for leading out the electrode is provided.

Then, Ta2O5 film having thickness of 500 nm was formed on the lower electrode by sputtering method. On the Ta2O5 film positive type liquid resist OFPR800, 500cp(product of Tokyo Ohka) was coated and after performing drying, exposing and developing process a resist mask for a dielectric layer was formed. Subsequently, dry etching was performed by making use of CF4 to remove unnecessary portions thereof, then, the resist mask was removed and the dielectric layer 3 was formed. In this instance, the area of the dielectric layer is formed larger than that of the lower electrode. In other words, the dielectric layer was formed so as to cover the side face of the lower electrode formed in circular shape.

Subsequently, photosensitive polyimide HD 6000(product of Hitachi Kasei) was coated by spin coating and after prebaking with a hot plate through exposing and developing process the dielectric layer on the lower electrode was exposed. In this instance, as shown in FIG. 3 the opening end portion of the polyimide is formed so as to locate at the inner side of the lower electrode end portion by 20 µm. The polyimide is hardened at 250° C./2 hours under nitrogen atmosphere and an insulator of 10 µm was formed.

Then, on the insulator and the dielectric layer exposed from the opening portion Cr film of 50 nm and further, Cu film of 500 nm were formed which was used as a seed film. On the Cu film negative type liquid resist PMER-N-CA 1000(product of Tokyo Ohka) was spin coated and after prebaking with a hot plate through exposing and developing process a resist mask was formed. At the opening portion of the resist plating of electrolytic copper of 10 µm was performed with current density of 1 A/dm. Thereafter, the resist mask was removed and the copper seed film was removed with copper etching liquid, Cobra etch (product of Ebara Densan). Further, by making use of Cr etching liquid of permanganic acid series, Cr seed film was removed and the upper electrode 4 was formed. In other words, as shown in FIGS. 3-2-*a* and 3-2-*b*, the upper electrode was formed so that a part of the surface of the dielectric layer is exposed from the opening of the insulator.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 2

In the like manner as in embodiment 1 thin film capacitors were produced. In this instance, benzocyclo butene resin cycloten 4026(product of Dow Chemical) was spin coated to form the insulator and after prebaking the same through the exposing and developing process, like embodiment 1 the opening end portion of the benzocyclo butene resin was formed to locate at the inner side of the lower electrode end portion by 20 µm. The resin was hardened at 250° C./1 hour under nitrogen atmosphere and an insulator of 10 µm was formed.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 3

Thin film capacitors were produced in a like manner as in embodiment 1. In this instance, the thin film capacitors were produced by making use of a material having low dielectric loss tangent, which was prepared in the following method as the insulator.

Three raw materials of synthesized 1,2-bis(vinylphenyl) ethane of 30 weight parts, cyclic polyolefin Zeonex 480 (product of Nihon Zeon) of 70 weight parts and hardening catalyst perhexyne 25B of 0.3 weight parts were resolved in xylene solvent so that solid component assumes 38% to produce a varnish.

The varnish was spin coated and the varnish was step cured on a hot plate in 120° C./2 minutes and then 200° C./5 minutes to form an insulator of 10 µm. On the cured varnish positive type liquid resist OFPR 800,500 cp was spin coated and after drying the same, through exposing and developing process a resist mask was formed in such a manner that the opening end portion thereof locates at the inner side of the lower electrode end portion by 20 µm. Subsequently, the low dielectric loss tangent material was dry etched with CF4 to expose the dielectric layer on the lower electrode. Finally, the resist was peeled off.

Herein, as the insulator of the present embodiment, a low dielectric loss tangent resin composition was used which includes a bridging component having a plurality of styrene groups as expressed by the following general chemical formula and contains polymers having weight average molecular weight of more than 5000,

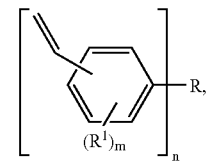

wherein R represents a hydrocarbon skeleton, which may includes a substituent, R1 represents one of hydrogen, methyl and ethyl, m represents 1 from 4 and n represents an integer more than 1.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 4

FIG. 4-1 is a cross sectional view of a thin film capacitor representing another embodiment of the present invention. FIG. 4-2-a is a plan view of the thin film capacitor of the present embodiment. FIG. 4-2-b is an exploded view of the present embodiment. The cross sectional view in FIG. 4-1 is taken along the cross sectional plan indicated in FIG. 4-2-a.

The thin film capacitor was produced in the following manner.

On the glass substrate 5, a Cr film of 50 nm and further, Cu film of 500 nm were formed, which was used as a seed film for feeding current during copper plating. On the Cu film negative type liquid resist PMER-N-CA 1000(product of Tokyo Ohka) was spin coated and after prebaking with a hot plate, through exposing and developing process a resist mask was formed. At the opening portion of the resist plating of electrolytic copper of 10 μm was performed with current density of 1 A/dm. Thereafter, the resist mask was removed and the copper seed film was removed with copper etching liquid, Cobra etch (product of Ebara Densan). Further, by making use of Cr etching liquid of permanganic acid series Cr seed film was removed and the lower electrode 2 was formed. In the present embodiment, the shape of the lower electrode is configured in a circle as shown in FIG. 4-2-a. Further, at the side thereof a wire lead for electrically connecting to the electrode is provided.

Then, Cr film of 50 nm as a barrier layer 7 was formed by sputtering method.

Then, Ta2O5 film having thickness of 500 nm was formed on the lower electrode by sputtering method. On the Ta2O5 film positive type liquid resist OFPR800, 500 cp(product of Tokyo Ohka) was coated and after performing drying, exposing and developing process a resist mask for a dielectric layer was formed. Subsequently, dry etching was performed by making use of CF4 to remove unnecessary portion thereof and further, unnecessary portion of the barrier layer was removed with Cr etching liquid of permanganic acid, then, the resist mask was removed and the dielectric layer 3 was formed. In this instance, like embodiment 1, the area of the dielectric layer is formed larger than that of the lower electrode.

Subsequently, photosensitive polyimide HD 6000(product of Hitachi Kasei) was coated by spin coating and after prebaking with a hot plate through exposing and developing process the dielectric layer on the lower electrode was exposed. In this instance, as shown in FIG. 4 the opening end portion of the polyimide is formed so as to locate at the inner side of the lower electrode end portion by 20 μm. The polyimide is hardened at 250° C./2 hours under nitrogen atmosphere and an insulator of 10 μm was formed.

Then, on the insulator and the dielectric layer exposed from the opening, a Cr film of 50 nm and further, Cu film of 500 nm were formed which was used as a seed film. On the Cu film negative type liquid resist PMER-N-CA 1000(product of Tokyo Ohka) was spin coated and after prebaking with a hot plate through exposing and developing process a resist mask was formed. At the opening portion of the resist plating of electrolytic copper of 10 μm was performed with current density of 1 A/dm. Thereafter, the resist mask was removed and the copper seed film was removed with copper etching liquid, Cobra etch (product of Ebara Densan). Further, by making use of Cr etching liquid of permanganic acid series Cr seed film was removed and the upper electrode was formed. In this instance, like embodiment 1, the area of the upper electrode 4 is formed to be smaller than that of the insulator opening portion.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 5

In the like manner as in embodiment 4 thin film capacitors were produced. In this instance, benzocyclo butene resin cycloten 4026(product of Dow Chemical) was spin coated to form the insulator and after prebaking the same at 85° C./90 s, through the exposing under 1200 mj/cm 2 and developing with developing liquid DS3000 at 36° C./3 min, like embodiment 4 the opening end portion of the benzocyclo butene resin was formed to locate at the inner side of the lower electrode end portion by 20 μm. The resin was hardened at 250° C./1 hour under nitrogen atmosphere and an insulator of 10 μm was formed.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 6

Thin film capacitors were produced in a like manner as in embodiment 4. In this instance, the thin film capacitors were produced by making use of a material having low dielectric loss tangent, which was prepared in the following method as the insulator.

Three raw materials of synthesized 1,2-bis(vinyl phenyl) ethane of 30 weight parts, cyclic polyolefin Zeonex 480 (product of Nihon Zeon) of 70 weight parts and hardening catalyst perhexyne 25B of 0.3 weight parts were resolved in xylene solvent so that solid component assumes 38% to produce a varnish.

The varnish was spin coated and the varnish was step cured on a hot plate in 120° C./2 minutes and then 200° C./5 minutes to form an insulator of 10 μm. On the cured varnish positive type liquid resist OFPR 800,500 cp was spin coated and after drying the same, through exposing and developing process a resist mask was formed in such a manner that the opening end portion thereof locates at the inner side of the lower electrode end portion by 20 μm. Subsequently, the low dielectric loss tangent material was dry etched with CF4 to expose the dielectric layer on the lower electrode. Finally, the resist was peeled off.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 7

Thin film capacitors were produced in the same manner as in embodiment 4. In this instance, the thickness of the lower electrode was selected to be 3 μm.

A current feed check was performed for 20 pieces of the thin film capacitors produced according to the above method. The result thereof is shown in FIG. 10. Although the defective rate of comparison thin film capacitors was 12/20, the defective rate of the present embodiment was 0/20.

EMBODIMENT 8

In the like manner as in embodiment 4, thin film capacitors were produced. In this instance, as the dielectric layer, benzocyclo butene resin cycloten 4026(product of Dow Chemical) was formed in the following manner. On the sudstrate where the lower electrode is formed, the benzocyclo butene resin cycloten 4022(product of Dow Chemical) was spin coated to form the dielectric layer and after prebaking the same at 85° C./90 s, through the exposing under 1200 mj/cm 2 and developing with developing liquid DS3000 at 36° C./3 min, the resin was hardened at 250° C./1 hour under nitrogen atmosphere and a dielectric layer of 5 μm was formed on the surface of the lower electrode.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 9

FIG. 5-1 is a cross sectional view of a thin film capacitor representing an embodiment of the present invention. FIG. 5-2-*a* is a plan view of the thin film capacitor of the present embodiment. FIG. 5-2-*b* is an exploded view of the thin film capacitor of the present embodiment. Further, FIG. 5-1 is the cross sectional view taken along the cross sectional plan indicated in

FIG. 5-2-*a*.

The thin film capacitor was produced in the following manner.

Platinum film of 2 μm was formed on a glass substrate 5 by sputtering method. Subsequently, positive type liquid resist OFPR800, 500 cp(product of Tokyo Ohka) is coated and after performing drying, exposing and developing process, a resist mask for a lower electrode was formed. Then, dry etching was performed by ion milling to remove unnecessary platinum portions, and after removing the resist mask the lower electrode 2 was formed. In the present embodiment, the shape of the lower electrode is formed in a circle as shown in FIGS. 5-2-*a* and 5-2-*b*. Further, at the side face thereof a lead wire for electrically connecting to the electrode is provided.

Then, Ta2O5 film having thickness of 500 nm was formed on the lower electrode by sputtering method. On the Ta2O5 film positive type liquid resist OFPR800, 500 cp(product of Tokyo Ohka) was coated and after performing drying, exposing and developing processes, a resist mask for a dielectric layer was formed. Subsequently, dry etching was performed by making use of CF4 to remove unnecessary portions thereof, then, the resist mask was removed and the dielectric layer 3 was formed. In this instance, like in embodiment 1, the area of the dielectric layer is formed larger than that of the lower electrode.

Subsequently, photosensitive polyimide HD 6000(product of Hitachi Kasei) was coated by spin coating and after prebaking with a hot plate, through exposing and developing processes the polyimide insulator was formed at the crossing portion between the lower electrode end portion and the upper electrode. The polyimide is hardened at 250° C./2 hours under nitrogen atmosphere and an insulator 6 was formed.

Then, on the insulator and the dielectric layer, a Cr film of 50 nm and further, Cu film of 500 nm were formed which was used as a seed film. On the Cu film negative type liquid resist PMER-N-CA 1000(product of Tokyo Ohka) was spin coated and after prebaking with a hot plate through exposing and developing process a resist mask was formed. At the opening portion of the resist, plating of electrolytic copper of 10 μm was performed with current density of 1 A/dm. Thereafter, the resist mask was removed and the copper seed film was removed with copper etching liquid, Cobra etch (product of Ebara Densan). Further, by making use of Cr etching liquid of permanganic acid series Cr seed film was removed and the upper electrode 4 was formed.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 10

In the like manner as in embodiment 9 thin film capacitors were produced. In this instance, benzocyclo butene resin cycloten 4026(product of Dow Chemical) was spin coated to form the insulator and after prebaking the same through the exposing and developing process, like embodiment 1 the insulator of the benzocyclo butene resin was at the crossing portion of the lower electrode end portion and the upper electrode. The resin was hardened at 250° C./1 hour under nitrogen atmosphere and the insulator was formed.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 11

Thin film capacitors were produced in a like manner as in embodiment 9. In this instance, the thin film capacitors were produced by making use of a material having low dielectric loss tangent, which was prepared in the following method as the insulator.

Three raw materials of synthesized 1,2-bis(vinyl phenyl) ethane of 30 weight parts, cyclic polyolefin Zeonex 480 (product of Nihon Zeon) of 70 weight parts and hardening catalyst perhexyne 25B of 0.3 weight parts were resolved in xylene solvent to produce a varnish having a solid component of 38%.

The varnish was spin coated and the varnish was step cured on a hot plate in 120° C./2 minutes and then 200° C./5 minutes to form an insulator of 10 μm. On the cured varnish, positive type liquid resist OFPR 800,500 cp was spin coated and after drying the same, through exposing and developing process a resist mask was formed in such a manner that the insulator was formed at the crossing portion of the lower electrode end portion and the upper electrode. The low dielectric loss tangent material is was dry etched with CF4 and the dielectric layer on the lower electrode was exposed. Finally, the resist was peeled off.

A current feed check was performed for 20 pieces of the thin film capacitors produced according to the above method. The result thereof is shown in FIG. 10. Although the defective rate of comparison thin film capacitors was 70%, the defective rate of the present embodiment was 0%.

EMBODIMENT 12

FIG. 6 is a cross sectional view of a thin film capacitor representing further embodiment of the present invention.

The thin film capacitor was produced in the following manner.

On the glass substrate 5 Cr film of 50 nm and further, Cu film of 500 nm were formed which was used as a seed film for feeding current during copper plating. On the Cu film negative type liquid resist PMER-N-CA 1000(product of Tokyo Ohka) was spin coated and after prebaking with a hot plate through exposing and developing process a resist mask was formed. At the opening portion of the resist plating of electrolytic copper of 10 µm was performed with current density of 1 A/dm. Thereafter, the resist mask was removed and the copper seed film was removed with copper etching liquid, Cobra etch (product of Ebara Densan). Further, by making use of Cr etching liquid of permanganic acid series Cr seed film was removed and the lower electrode 2 was formed.

Then, Cr of 50 nm as a barrier layer 7 was formed by sputtering method.

Then, Ta2O5 film having thickness of 500 nm was formed on the lower electrode by sputtering method. On the Ta2O5 film positive type liquid resist OFPR800, 500 cp(product of Tokyo Ohka) was coated and after performing drying, exposing and developing processes, a resist mask for a dielectric layer was formed. Subsequently, dry etching was performed by making use of CF4 to remove unnecessary portions thereof and further, unnecessary portions of the barrier layer were removed with Cr etching liquid of permanganic acid. Then, the resist mask was removed and the dielectric layer 3 was formed.

Subsequently, photosensitive polyimide HD 6000(product of Hitachi Kasei) was coated by spin coating and after prebaking with a hot plate, through exposing and developing process the polyimide insulator was formed at the crossing portion of the lower electrode end portion and the upper electrode. The polyimide is hardened at 250° C./2 hours under nitrogen atmosphere and the insulator 6 of 10 µm was formed.

Then, on the insulator and the dielectric layer exposed from the opening, a Cr film of 50 nm and further, Cu film of 500 nm were formed which was used as a seed film. On the Cu film negative type liquid resist PMER-N-CA 1000(product of Tokyo Ohka) was spin coated and after prebaking with a hot plate through exposing and developing process a resist mask was formed. At the opening portion of the resist plating of electrolytic copper of 10 µm was performed with current density of 1 A/dm. Thereafter, the resist mask was removed and the copper seed film was removed with copper etching liquid, Cobra etch (product of Ebara Densan). Further, by making use of Cr etching liquid of permanganic acid series Cr seed film was removed and the upper electrode 4 was formed.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 13

In the like manner as in embodiment 12 thin film capacitors were produced. In this instance, benzocyclo butene resin cycloten 4026(product of Dow Chemical) was spin coated to form the insulator and after prebaking the same, through the exposing and developing process, like embodiment 12, it is processed so that the insulator of benzocyclo butene resin was formed at the cross section of the lower electrode end portion and the upper electrode. The resin was hardened at 250° C./1 hour under nitrogen atmosphere and an insulator of 10 µm was formed.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 14

Thin film capacitors were produced in a like manner as in embodiment 12. In this instance, the thin film capacitors were produced by making use of a material having low dielectric loss tangent, which was prepared in the following method as the insulator.

Three raw materials of synthesized 1,2-bis(vinyl phenyl) ethane of 30 weight parts, cyclic polyolefin Zeonex 480 (product of Nihon Zeon) of 70 weight parts and hardening catalyst perhexyne 25B of 0.3 weight parts were resolved in xylene solvent to produce a varnish having a solid component of 38%.

The varnish was spin coated and the varnish was step cured on a hot plate in 120° C./2 minutes and then 200° C./5 minutes to form an insulator of 10 µm. On the cured varnish positive type liquid resist OFPR 800,500 cp was spin coated and after drying the same, through exposing and developing process a resist mask was formed in such a manner that the low dielectric loss tangent material insulator was formed at the crossing portion of the lower electrode end portion and the upper electrode. Subsequently, the low dielectric loss tangent material was dry etched with CF4 to expose the dielectric layer on the lower electrode. Finally, the resist was peeled off.

A current feed check was performed for 20 pieces of the thin film capacitors produced according to the above method. The result thereof is shown in FIG. 10. Although the defective rate of comparison thin film capacitors was 14/20, the defective rate of the present embodiment was 0/20.

EMBODIMENT 15

FIG. 7 is a cross sectional view of an electronic circuit part representing an embodiment of the present invention. The electronic circuit part was produced in the following manner.

On a non alkaline glass substrate OA-10 (product of Nihon Denki Glass) having thickness of 0.5 mm sand blast use film resist material Ohdeel(product of Tokyo Ohka) of 100 µm was laminated and through exposing and developing process an etching use resist was formed. Subsequently, with micro sand blast method, via holes 8 were formed in the glass substrate 5. Then, after peeling off the resist film, electroplating use seed films Cr:50 nm and Cu:500 nm were formed on the surface of the glass substrate and on the inner wall of the via holes with sputtering method. After laminating plating use film resist HN 920(product of Hitachi Kasei) on the Cu film, through exposure and development a plating resist mask was formed, then, conductive layer 9 inside the via holes was formed by Cu electroplating. Thereafter, the resist was peeled off and the electroplating seed film was peeled off.

On the substrate a plurality of the capacitors were formed in the same manner as in embodiment 1. Then, as a surface protective layer photosensitive polyimide HD 6000(product of HDMS) was spin coated and prebaked, thereafter, through exposure and development such as scribe lines were formed and after hardening the same the surface protective layer was formed.

Subsequently, on the opposite face from where the capacitors were formed, a TaN film of 500 nm was formed for preparing resistor elements by sputtering method. On the film, positive type liquid resist OFPR 800,100cp was spin coated and prebaked, and through exposure and development a resist pattern mask was formed. By making use of the mask the TaN film was dry etched with CF4. Then, the resist was peeled off and a plurality of resistor elements 12 were formed.

On the face where the resistor elements were formed electroplating use seed films Cr:50 nm and Cu:500 nm were formed. On the Cu film negative type liquid resist material PMER-N-CA 1000(product of Tokyo Ohka) was spin coated and prebaked, thereafter, through exposure and development plating resist mask was formed, then, a plating film of 10 μm was formed by Cu electroplating. Finally, the resist was peeled off, the electroplating seed film was peeled off and wirings 13 connecting the via holes and the resistor elements were formed.

On the surface where the wirings were formed photosensitive poyimide HD 6000(product of HDMS)was spin coated and prebaked, thereafter, through exposure and development openings 14 for interlayer connection were formed and after hardening at 250° C./1 hour inter layer insulation layers 15 were formed.

In order to form such as wirings and inductor elements on the surface of the inter layer insulation layers, electroplating use seed films Cr:50 nm and Cu:500 nm were formed. On the Cu film negative type liquid resist material PMER-N-CA 1000(product of Tokyo Ohka) was spin coated and prebaked, and through exposure and development a plating resist mask was formed, then a plating film of 10 μm was formed by Cu electroplating. Finally, the resist was peeled off, the electroplating seed film was peeled off and a plurality of inductor elements 16 and wirings were formed.

On the surface where the inductor elements were formed photosensitive poyimide HD 6000(product of HDMS)was spin coated and prebaked, thereafter through exposure and development openings 14 for interlayer connection were formed and after hardening at 250° C./1 hour inter layer insulation layers 15 were formed.

In order to form external electrode use areas 17 on the surface of inter layer insulation layer, electroplating use seed films Cr:50 nm and Cu:500 nm were formed. On the Cu film negative type liquid resist material PMER-N-CA 1000(product of Tokyo Ohka) was spin coated and prebaked, thereafter, through exposure and development plating resist mask was formed, then, a plating film of 10 μm was formed by Cu electroplating. Finally, the resist was peeled off, the electroplating seed film was peeled off and wirings and the external electrode use areas 17 were formed.

On the surface where the external electrode use areas 17 were formed, photosensitive poyimide HD 6000(product of HDMS)was spin coated and prebaked, thereafter, through exposure and development openings for forming the external electrodes and after hardening at 250° C./1 hour surface protective layers 11 were formed.

After applying non electrolytic gold plating processing on the surface of the external electrode use areas and solder flux was coated on predetermined portions with a metal mask, then lead free solder balls having diameter of 200 μm were arranged and through reflow processing the external electrodes 18 were formed.

Finally, the product was separated by making use of a dicing device and the electronic circuit parts were formed.

A performance check of 20 pieces of the electronic circuit parts produced in the above method was performed. The result thereof is shown in FIG. 10. The defective rate was 0/20.

EMBODIMENT 16

Figure 8:
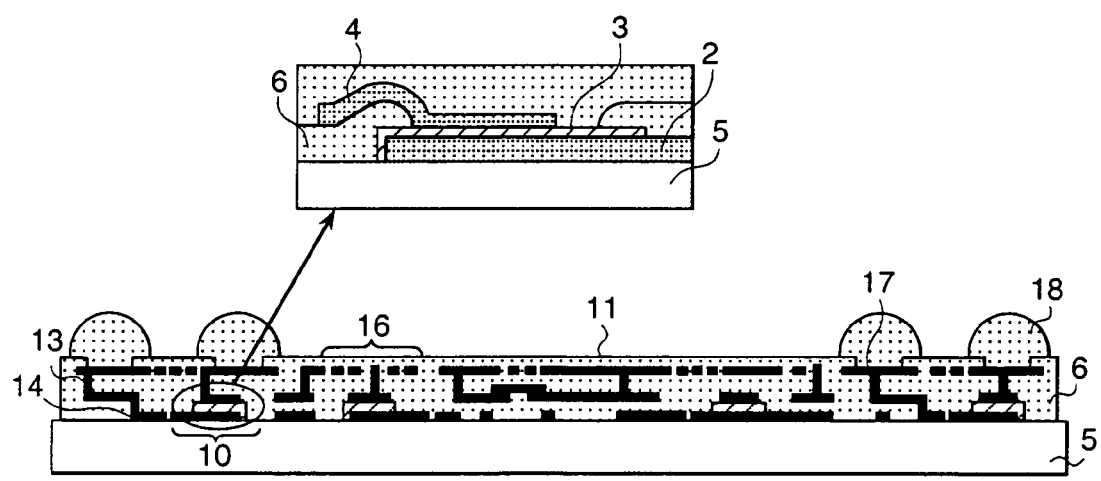
FIG. 8 is a schematic cross sectional view of an electronic circuit part representing another embodiment of the present invention.

FIG. 8 is a cross sectional view of an electronic circuit part representing another embodiment of the present invention. The electronic circuit part is produced in the following manner.

For the first time, in the like manner as in embodiment 2, a plurality of capacitors were formed on the glass substrate 5. Herein, when forming the lower electrode, wiring 13 for connection was formed, and when forming the insulator 6, opening portions 14 for leading out the wiring on the insulator were formed and still further, when forming the upper electrode, wirings for connection and a plurality of spiral inductors 16 were at the same time formed.

On the surface having the upper electrode and the spiral inductors, benzocyclo butene resin cycloten 4026(product of Dow Chemical) serving as the inter layer insulation layer 15 was spin coated and prebaked, and through exposure and development openings for interlayer connection were formed. Then, the same was hardened at 250° C./1 hour under nitrogen atmosphere and the interlayer insulation layer was formed.

In order to form external electrode use areas 17 on the surface of inter layer insulation layer, electroplating use seed films Cr:50 nm and Cu:500 nm were formed. On the Cu film negative type liquid resist material PMER-N-CA 1000(product of Tokyo Ohka) was spin coated and prebaked, and through exposure and development a plating resist mask was formed, then, a plating film of 10 μm was formed by Cu electroplating. Finally, the resist was peeled off, the electroplating seed film was peeled off and wirings and the external electrode use lands 17 were formed.

On the surface where the wirings and the external electrode use areas 17 were formed, the benzo cyclo butene resin cycloten 4026 (product of Dow Chemical)was spin coated and prebaked, and through exposure and development openings for forming the external electrodes and after hardening at 250° C./1 hour surface protective layers 11 were formed.

After applying non electrolytic gold plating processing on the surface of the external electrode use areas, solder flux was coated on predetermined portions with a metal mask, then lead free solder balls having diameter of 200 μm were arranged and through reflow processing the external electrodes 18 were formed.

Finally, the product was separated by making use of a dicing device and the electronic circuit parts were formed.

A performance check of 20 pieces of the electronic circuit parts produced in the above method was performed. The result thereof is shown in FIG. 10. The defective rate was 0/20.

EMBODIMENT 17

Figure 9:
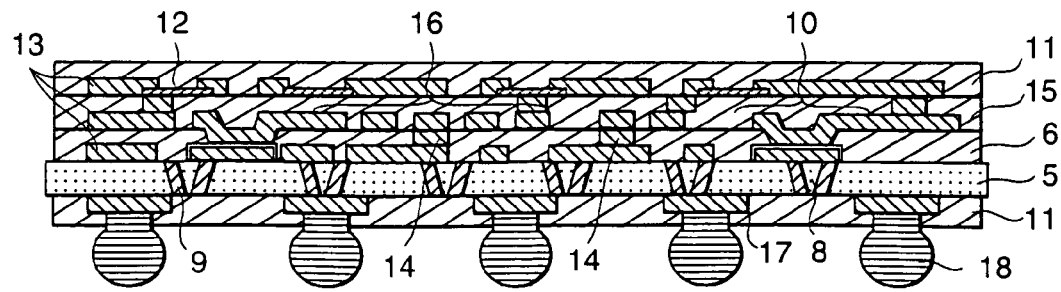
FIG. 9 is a schematic cross sectional view of an electronic circuit part representing still another embodiment of the present invention.

FIG. 9 is a cross sectional view of an electronic circuit part representing an embodiment of the present invention. The electronic circuit part was produced in the following manner.

On a non alkaline glass substrate OA-10 (product of Nihon Denki Glass) having thickness of 0.5 mm sand blast use film resist material Ohdeel(product of Tokyo Ohka) of 100 μm was laminated and through exposing and developing process an etching use resist was formed. Subsequently, with micro sand blast method, via holes 8 were formed in the glass substrate 5. Then, after peeling off the resist film, electroplating use seed films Cr:50 nm and Cu:500 nm were formed on the surface of the glass substrate and on the inner wall of the via holes with sputtering method. After laminating plating use film resist HN 920(product of Hitachi Kasei) on the Cu film, through exposure and development a plating resist mask was formed, then, conductive layer 9 inside the via holes was formed by Cu electroplating. Thereafter, the resist was peeled off and the electroplating seed film was peeled off.

On the substrate a plurality of the capacitors were formed in the same manner as in embodiment 3. Herein, when forming the lower electrode, wiring 13 for connection was formed, and when forming the insulator 6, opening portions 14 for leading out the wiring on the insulator were formed and still further, when forming the upper electrode, wirings for connection and a plurality of spiral inductors 16 were at the same time formed.

On the face having the upper electrode, the wirings and the spiral inductor, the interlayer insulation layer 15 was formed by making use of a low dielectric loss tangent material with the following method.

Three raw materials of synthesized 1,2-bis(vinyl phenyl) ethane of 30 weight parts, cyclic polyolefin Zeonex 480 (product of Nihon Zeon) of 70 weight parts and hardening catalyst perhexyne 25B of 0.3 weight parts were resolved in xylene solvent to produce a varnish having a solid component of 38%.

The varnish was spin coated and the varnish was step cured on a hot plate in 120° C./2 minutes and then 200° C./5 minutes to form an insulator of 10 μm. On the cured varnish positive type liquid resist OFPR 800,500cp was spin coated and after drying the same, through exposing and developing process a resist mask where the opening portions for the interlayer connection was formed. Subsequently, the low dielectric loss tangent material was dry etched with CF4 to form the opening portions 14. Finally, the resist was peeled off.

On the interlayer insulation layer, TaN film of 500 was formed for preparing resistor elements by sputtering method. On the layer positive type liquid resist OFPR 800,100cp was spin coated and prebaked, and through exposure and development a resist pattern mask was formed. By making use of the mask the TaN film was dry etched with CF4. Then, the resist was peeled off and a plurality of resistor elements were formed.

On the face where the resistor elements were formed electroplating use seed films Cr:50 nm and Cu:500 were formed. On the Cu film negative type liquid resist material PMER-N-CA 1000(product of Tokyo Ohka) was spin coated and prebaked, thereafter, through exposure and development plating resist mask was formed, then, a plating film of 10 μm was formed by Cu electroplating. Finally, the resist was peeled off, the electroplating seed film was peeled off and wirings 13 connecting the upper electrode, the spiral inductors and resistor elements through the interlayer insulation layer opening portions were formed.

On the surface where the wirings were formed, the surface protective layer 11 was formed by making use of a low dielectric constant material with the like method as above.

In order to form the wirings 13 and external electrode use areas 17 on the opposite surface from where the surface protective layer was formed, electroplating use seed films Cr:50 nm and Cu:500 were formed. On the Cu film negative type liquid resist material PMER-N-CA 1000(product of Tokyo Ohka) was spin coated and prebaked, and through exposure and development a plating resist mask was formed, then, a plating film of 10 μm was formed by Cu electroplating. Finally, the resist was peeled off, the electroplating seed film was peeled off and wirings and the external electrode use areas 17 were formed.

On the surface where the wiring 13 and the external electrode use lands 17 were formed, photosensitive poyimide HD 6000(product of HDMS)was spin coated and prebaked, thereafter, through exposure and development openings for forming the external electrodes and after hardening at 250° C./1 hour the surface protective layers 11 were formed.

After applying non electrolytic gold plating processing on the surface of the external electrode use areas, solder flux was coated on predetermined portions with a metal mask, and then lead free solder balls having diameter of 200 μm were arranged and through reflow processing the external electrodes 18 were formed.

Finally, the product was separated by making use of a dicing device and the electronic circuit parts were formed.

A performance check of 20 pieces of the electronic circuit parts produced in the above method was performed. The result thereof is shown in FIG. 10. The defective rate was 0/20.

EMBODIMENT 18

In the same manner as in embodiment 15, electronic circuit components were prepared. Herein, the plurality of capacitors were prepared according to the method as in embodiment 4. The performance of 20 pieces of electronic circuit components was checked. The result thereof is shown in FIG. 10. The defective rate thereof was 0/20.

EMBODIMENT 19

In the same manner as in embodiment 16, electronic circuit components were prepared. Herein, the plurality of capacitors were prepared according to the method as in embodiment 5. The performance of 20 pieces of electronic circuit components was checked. The result thereof is shown in FIG. 10. The defective rate thereof was 0/20.

EMBODIMENT 20

In the same manner as in embodiment 17, electronic circuit components were prepared. Herein, the plurality of capacitors were prepared according to the method as in embodiment 6. The performance of 20 pieces of electronic circuit components was checked. The result thereof is shown in FIG. 10. The defective rate thereof was 0/20.

EMBODIMENT 21

In the same manner as in embodiment 15, electronic circuit components were prepared. Herein, the plurality of capacitors were prepared according to the method as in embodiment 9. The performance of 20 pieces of electronic circuit components was checked. The result thereof is shown in FIG. 10. The defective rate thereof was 0/20.

EMBODIMENT 22

In the same manner as in embodiment 16, electronic circuit components were prepared. Herein, the plurality of capacitors were prepared according to the method as in embodiment 10. The performance of 20 pieces of electronic circuit components was checked. The result thereof is shown in FIG. 10. The defective rate thereof was 0/20.

EMBODIMENT 23

In the same manner as in embodiment 17, electronic circuit components were prepared. Herein, the plurality of capacitors were prepared according to the method as in embodiment 11. The performance of 20 pieces of electronic circuit components was checked. The result thereof is shown in FIG. 10. The defective rate thereof was 0/20.

EMBODIMENT 24

In the same manner as in embodiment 15, electronic circuit components were prepared. Herein, the plurality of capacitors were prepared according to the method as in embodiment 12. The performance of 20 pieces of electronic circuit components was checked. The result thereof is shown in FIG. 10. The defective rate thereof was 0/20.

EMBODIMENT 25

In the same manner as in embodiment 16, electronic circuit components were prepared. Herein, the plurality of capacitors were prepared according to the method as in embodiment 13. The performance of 20 pieces of electronic circuit components was checked. The result thereof is shown in FIG. 10. The defective rate thereof was 0/20.

EMBODIMENT 26

In the same manner as in embodiment 17, electronic circuit components were prepared. Herein, the plurality of capacitors were prepared according to the method as in embodiment 14. The performance of 20 pieces of electronic circuit components was checked. The result thereof is shown in FIG. 10. The defective rate thereof was 0/20.

Comparison 1

The thin film capacitor of the comparison was produced in the following manner.

On the glass substrate, Cr film of 50 nm and further, Cu film of 500 nm were formed which was used as a seed film for feeding current during copper plating. On the Cu film negative type liquid resist PMER-N-CA 1000(product of Tokyo Ohka) was spin coated and after prebaking with a hot plate through exposing and developing process a resist mask was formed. At the opening portion of the resist plating of electrolytic copper of 10 μm was performed with current density of 1 A/dm. Thereafter, the resist mask was removed and the copper seed film was removed with copper etching liquid, Cobra etch (product of Ebara Densan). Further, by making use of Cr etching liquid of permanganic acid series Cr seed film was removed and the lower electrode was formed.

Then, Cr of 50 nm as a barrier layer was formed by sputtering method.

Then, Ta2O5 film having thickness of 500 nm was formed on the lower electrode by sputtering method. On the Ta2O5 film positive type liquid resist OFPR800, 500cp(product of Tokyo Ohka) was coated and after performing drying, exposing and developing processes, a resist mask for a dielectric layer was formed. Subsequently, dry etching was performed by making use of CF4 to remove unnecessary portions thereof and further, unnecessary portions of the barrier layer were removed with Cr etching liquid of permanganic acid, then, the resist mask was removed and the dielectric layer was formed.

Then, on the dielectric layer, Cr film of 50 nm and further, Cu film of 500 nm were formed which was used as a seed film. On the Cu film negative type liquid resist PMER-N-CA 1000(product of Tokyo Ohka) was spin coated and after prebaking with a hot plate through exposing and developing process a resist mask was formed. At the opening portion of the resist plating of electrolytic copper of 10 μm was performed with current density of 1 A/dm. Thereafter, the resist mask was removed and the copper seed film was removed with copper etching liquid, Cobra etch(product of Ebara Densan). Further, by making use of Cr etching liquid of permanganic acid series Cr seed film was removed and the upper electrode was formed.

A current feed check was performed for 20 pieces of the thin film capacitors produced according to the above method. The result thereof is shown in FIG. 10. The defective rate of the comparison thin film capacitors was 14/20.

Comparison 2

Thin film capacitors were produced in the same manner as in comparison 1. In this instance, the thickness of the lower electrode was selected to be 3 μm.

A current feed check was performed for 20 pieces of the thin film capacitors produced according to the above method. The result thereof is shown in FIG. 10. The defective rate of comparison thin film capacitors was 12/20.

According to the present invention, since the insulator other than the dielectric layer are formed over the lower electrode end portion and the side face thereof, even when the thickness of the dielectric layer formed over the lower electrode end portion and the side face thereof is thinner than that on the lower electrode and includes defects therein, shorting between the upper and lower electrodes can be prevented by the insulator. For this reason, thin film capacitors of less defective rate can be realized. Further, the yield of the electronic circuit components using such capacitors is improved.

What is claimed is:

1. A thin film capacitor comprising: a substantially circular or rectangular lower electrode formed on a surface, the substantially circular or rectangular lower electrode having one or more end portions with one or more side faces; a dielectric layer formed on the substantially circular or rectangular lower electrode, the dielectric layer having one or more end portions with one or more side faces; and an upper electrode formed on the dielectric layer, the dielectric layer covering all of the end portions of the substantially circular or rectangular lower electrode and all of the side faces of the end portions thereof, the dielectric layer further covered by an insulator other than the dielectric layer, the insulator covering all of the end portions and all of the side faces of the dielectric layer, wherein the insulator is provided with an opening, an end portion of the opening is formed inside the end portion of the substantially circular or rectangular lower electrode and the upper electrode is formed in the opening, such that a relationship between an area of the dielectric layer, the substantially circular or rectangular lower electrode, a portion of the substantially circular or rectangular lower electrode not covered by the insulator, and the upper electrode is: area of dielectric layer>area of substantially circular or rectangular lower electrode>area of portion of the substantially circular or rectangular lower electrode not covered by the insulator>area of upper electrode.

2. A thin film capacitor according to claim 1, wherein the insulator is polyimide resin.

3. A thin film capaciator according to claim 1, wherein, the insulator is benzocyclo butene copolymer.

4. A thin film capacitor according to claim 1, wherein the insulator is a low dielectric loss tangent resin composition which includes a bridging component having a plurality of styrene groups as expressed by the following chemical formula and contains polymers having an average molecular weight of more than 5000

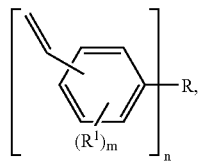

wherein R represents a hydrocarbon skeleton which optionally includes a substituent, $R^1$ represents one of hydrogen, methyl and ethyl, m is 1 to 4, and n is an integer greater than 1.

5. A thin film capacitor according to claim 1, wherein the dielectric layer is $Ta_2O_5$.

6. A thin film capacitor according to claim 1, wherein the lower electrode is copper.

7. A thin film capacitor according to claim 1, wherein, the thickness relationship between the lower electrode and the insulator is insulator>lower electrode.

8. A thin film capacitor according to claim 1, wherein the thickness of the upper and lower electrodes is more than 3 μm.

9. A thin film capacitor according to claim 1, wherein the dielectric layer and the insulator are composed of the same organic material and wherein a relationship between the thickness of the dielectric layer and the insulator is dielectric layer≧insulator.

10. A thin film capacitor according to claim 1, wherein a material protecting an end portion of the lower electrode and the insulator are formed of a same organic material.

11. A thin film capacitor according to claim 1, wherein a relationship between the dielectric constant of the dielectric layer and the insulator is dielectric layer≧insulator.

12. A thin film capacitor according to claim 1, wherein a relationship between a thickness of the dielectric layer and the insulator is insulator>dielectric layer.

13. A thin film capacitor comprising: a substantially circular or rectangular lower electrode formed on a surface, the substantially circular or rectangular lower electrode having one or more end portions with one or more side faces; a dielectric layer formed on the substantially circular or rectangular lower electrode, the dielectric layer having one or more end portions with one or more side faces; an upper electrode formed on the dielectric layer; and a barrier layer formed between the dielectric layer and the substantially circular or rectangular lower electrode, the dielectric layer covering all of the end portions of the substantially circular or rectanaular lower electrode and all of the side faces of the end portions thereof, the dielectric layer further covered by an insulator other than the dielectric layer, the insulator covering all of the end portions and all of the side faces of the dielectric layer, wherein the insulator is provided with an opening, an end portion of the opening is formed inside the end portion of the substantially circular or rectangular lower electrode and the upper electrode is formed in the opening, such that a relationship between an area of the dielectric layer, the substantially circular or rectangular lower electrode, a portion of the substantially circular or rectangular lower electrode not covered by the insulator, and the upper electrode is: area of dielectric layer>area of substantially circular or rectangular lower electrode>area of portion of the substantially circular or rectangular lower electrode not covered by the insulator>area of upper electrode.

14. A thin film capacitor according to claim 13, wherein the barrier layer is chromium.

15. A thin film capacitor according to claim 13, wherein the thickness relationship between the lower electrode, the dielectric layer and the barrier layer is lower electrode>dielectric layer>barrier layer.

* * * * *